United States Patent
Tamersoy et al.

(10) Patent No.: US 11,815,576 B2
(45) Date of Patent: Nov. 14, 2023

(54) METHOD FOR CORRECTING OBJECT SPECIFIC INHOMOGENEITIES IN AN MR IMAGING SYSTEM

(71) Applicant: Siemens Healthcare GmbH, Erlangen (DE)

(72) Inventors: Birgi Tamersoy, Erlangen (DE); Boris Mailhe, Plainsboro, NJ (US); Vivek Singh, Princeton, NJ (US); Ankur Kapoor, Plainsboro, NJ (US); Mariappan S. Nadar, Plainsboro, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/699,619

(22) Filed: Mar. 21, 2022

(65) Prior Publication Data
US 2022/0334204 A1    Oct. 20, 2022

(30) Foreign Application Priority Data
Apr. 14, 2021   (EP) .................................... 21168347

(51) Int. Cl.
*G01R 33/3875* (2006.01)
*G06N 20/00* (2019.01)
(Continued)

(52) U.S. Cl.
CPC ....... *G01R 33/3875* (2013.01); *G01R 33/443* (2013.01); *G01R 33/5608* (2013.01); *G06N 20/00* (2019.01)

(58) Field of Classification Search
None
See application file for complete search history.

(56) References Cited

U.S. PATENT DOCUMENTS

| 9,360,541 B2 | 6/2016 | Biber |
| 2001/0053877 A1 | 12/2001 | Brand et al. |

(Continued)

FOREIGN PATENT DOCUMENTS

EP   3798661 A1   3/2021

OTHER PUBLICATIONS

Meliado E.F.et al.: "Intersubject specific absorption rate variability analysis through construction of 23 realistic body models for prostate imaging at 7T", 2019;81:2106-2119. https://doi.org/10.1002/mrm.27518.

(Continued)

*Primary Examiner* — Rodney E Fuller

(57) ABSTRACT

Object specific in-homogeneities in an MRI system are corrected. Prescan information available at the MR imaging system is determined. The prescan information includes at least object specific information of an object located in the MR imaging system from which an MR image is to be generated. The prescan information does not include a B1 map of the MRI system with the object being present in the MR imaging system. The prescan information is applied to a trained machine learning module provided at the MRI system. The trained machine learning module determines and generates shimming information as output. The shimming information is applied to a shimming module of the MR imaging system, wherein the shimming module uses the shimming information to generate a corrected magnetic field B0.

15 Claims, 2 Drawing Sheets

(51) Int. Cl.
G01R 33/44 (2006.01)
G01R 33/56 (2006.01)

(56) References Cited

U.S. PATENT DOCUMENTS

| | | | | |
|---|---|---|---|---|
| 2011/0206260 | A1* | 8/2011 | Bergmans | G01R 33/543 |
| | | | | 382/131 |
| 2017/0123027 | A1 | 5/2017 | Zuehlsdorff et al. | |
| 2017/0173262 | A1* | 6/2017 | Veltz | G16H 20/17 |
| 2018/0144467 | A1* | 5/2018 | Sofka | G01R 33/445 |

OTHER PUBLICATIONS

Yuhang, Shi: "Rapid phase unwrapping with deep learning for shimming applications"; Proceedings of the ISMRM & SMRT Virtual Conference & Exhibition; Aug. 8-14, 2020, No. 3579, Jul. 24, 2020 (Jul. 24, 2020).

Anonymous, "Distortion Correction Using Learned B0 Maps ED—Darl Kuhn"; ip.com, ip.com inc., West Henrietta, NY, US; Dec. 27, 2019 (Dec. 27, 2019), XP013185334, ISSN: 1533-0001.

Yuhang, Shi et al: "Template-based field map prediction for rapid whole brain B0 shimming: Template-Based Field Map Prediction"; Magnetic Resonance in Medicine, vol. 80, No. 1, Nov. 28, 2017 (Nov. 28, 2017), pp. 171-180.

EP Search report in EP Application 21168347.9, dated Oct. 15, 2021, 9 pages.

Meliadò, E. F., et al. "A deep learning method for image-based subject-specific local SAR assessment." Magnetic resonance in medicine 83.2 (2020): 695-711.

\* cited by examiner

METHOD FOR CORRECTING OBJECT SPECIFIC INHOMOGENEITIES IN AN MR IMAGING SYSTEM

RELATED APPLICATION

This application claims the benefit of EP 21168347.9, filed Apr. 14, 2021, which is hereby incorporated by reference in its entirety.

TECHNICAL FIELD

The present application relates to a method for correcting object specific inhomogeneities in an MR imaging system, to the corresponding MR imaging system, and a computer program including program code. Furthermore, a carrier or non-transitory computer readable storage medium including the computer program is provided.

BACKGROUND

In Magnetic Resonance Imaging, MRI, shimming is used prior to the operation of the magnet to eliminate inhomogeneities in its field. Some of the key features affecting image quality in an MRI system are the magnetic field strengths B0 homogeneity, the maximum field of view and the shimming capabilities of the system. Any inhomogeneity in the magnetic field increases the noise and hence deteriorates the signal-to-noise ratio, SNR, of the imaging system. Applications like spectral fat saturation and water excitation are especially sensitive to magnetic field inhomogeneities since the chemical shift that they are trying to distinguish is very small, by way of example the chemical shift between fat and water is 3.5 parts per million, ppm.

Shimming is the process of making the magnetic field B0 more homogeneous. Two main types of shimming are known. First, in the installation shim, the magnetic field B0 of an empty magnet is corrected, and, second, in a patient or object specific shim, the inhomogeneities caused by the object are corrected. Since the object caused inhomogeneities can be in orders of several ppm, the estimation and correction of these inhomogeneities plays a crucial role and is important for a satisfying image quality.

Traditionally, the object specific shimming is done by first measuring the field inhomogeneities, accordingly by carrying out a separate shimming scan. These measurements are then used for calculating the optimal shim currents for improving the magnetic field homogeneity in the selected shim volume. During the calculation of the optimal shim currents, the information about the available shim hardware may also be used. In general, the acquisition of the object specific shimming and the computation of optimum shimming parameters given the object specific shimming scan is a time-consuming task.

Accordingly, a need exists to further improve and accelerate the shimming of an MRI system, especially the object specific shim.

SUMMARY

This need is met by the features of the embodiments. Further aspects are described below.

According to a first aspect, a method for correcting object specific inhomogeneities in an MR imaging system is provided. The method includes the act of determining pre-scan information available at the MR imaging system, wherein the pre-scan information includes at least object specific information of the object located in the MR imaging system from which an MR image is to be generated. The pre-scan information does not include a B1 map or information from a separate shimming scan of the MR imaging system with the object being present in the MR imaging system. The pre-scan information is applied to a trained machine learning module provided at the MR imaging system, wherein the trained machine learning module determines and generates shimming information as output. The shimming information is then applied to a shimming module of the MR imaging system wherein the shimming module uses the shimming information to generate a corrected magnetic field B0.

Furthermore, the corresponding MR imaging system is provided which includes the trained machine learning module and a shimming module configured to generate a corrected magnetic field B0. The MR imaging system is configured to operate as discussed above or as discussed in further detail below.

Furthermore, a computer program including program code is provided which, when executed by the MR imaging system, causes the MR imaging system to perform a method as mentioned above or as discussed further below.

Additionally, a carrier including the computer program is provided wherein the carrier is one of an electronic signal, optical signal, radio signal, or non-transitory computer readable storage medium.

The embodiments provide an optimized shimming procedure at a reduced time frame, as a separate shimming scan is not necessary.

It is to be understood that the features mentioned above and features yet to be explained below can be used not only in the respective combinations indicated, but also in other combinations or in isolation without departing from the scope of the invention.

Features of the above-mentioned aspects and embodiments described below may be combined with each other in other embodiments unless explicitly mentioned otherwise.

BRIEF DESCRIPTION OF THE DRAWINGS

The foregoing and additional features and effects of the invention will become apparent from the following detailed description when read in conjunction with the accompanying drawings in which like reference numerals refer to like elements.

DETAILED DESCRIPTION

Figure 1:
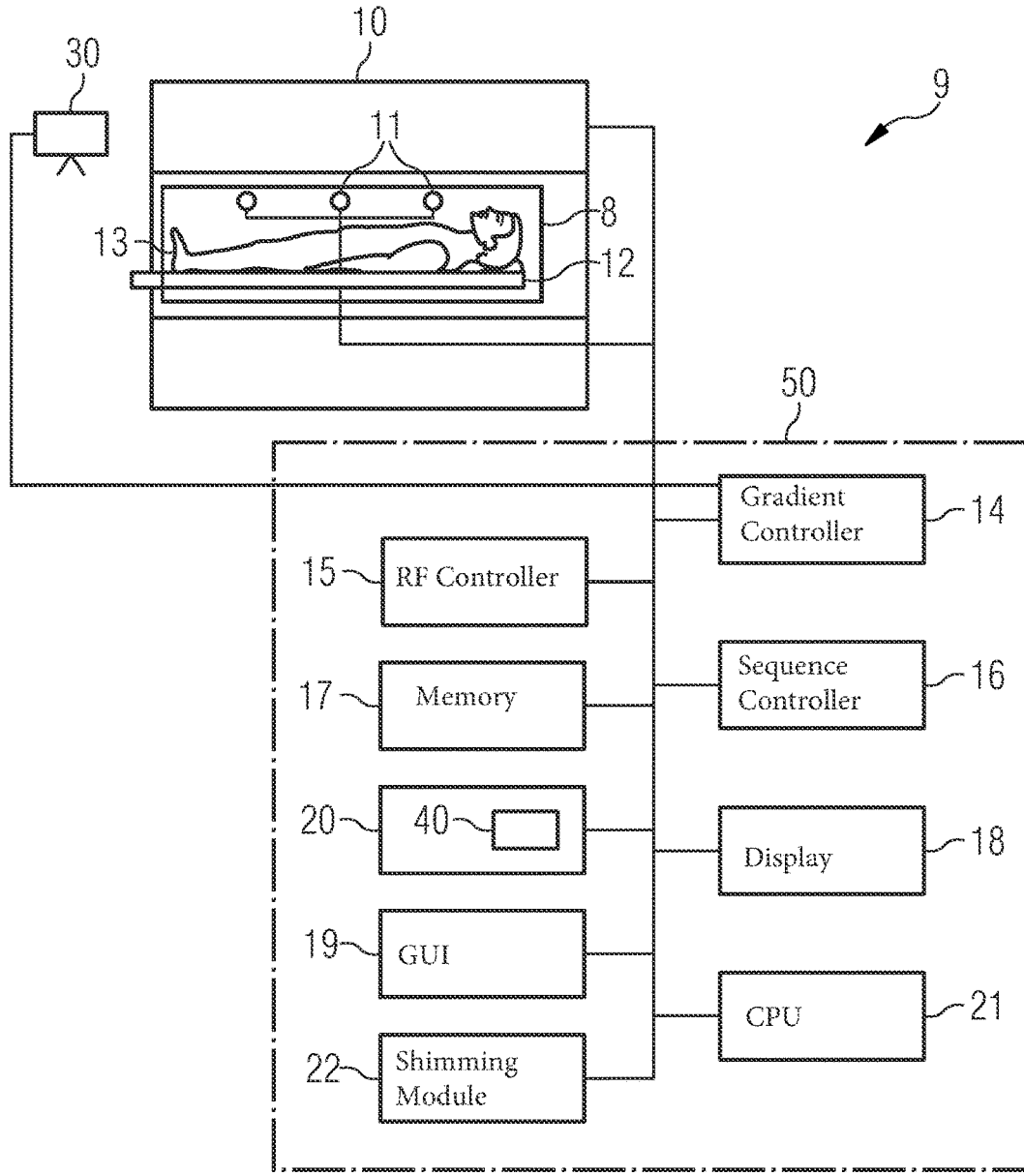
FIG. 1 shows a schematic view of one embodiment an MR imaging system configured to correct object specific inhomogeneities.

In the following, embodiments of the invention will be described in detail with reference to the accompanying drawings. It is to be understood that the following description of embodiments is not to be taken in a limiting sense. The scope of the invention is not intended to be limited by the embodiments described hereinafter or by the drawings, which are to be illustrative only.

The drawings are to be regarded as being schematic representations and elements illustrated in the drawings are not necessarily shown to scale. Rather, the various elements are represented such that their function and general purpose becomes apparent to a person skilled in the art. Any connection or coupling between functional blocks, devices, components of physical or functional units shown in the drawings and described hereinafter may also be implemented by an indirect connection or direct coupling. A coupling between components may be established over a wired or wireless connection. Functional blocks may be implemented in hardware, software, firmware, or a combination thereof.

As will be discussed below, a machine learning approach is used for directly estimating the optimum shim parameters given a pre-scan information. The pre-scan information can include object specific information but does not include a B1 map or any other dedicated shimming scan acquired only for the purpose of improving the B0 homogeneity of the MR imaging system. As known, a B1 map is a map which shows how the flip angle of the RF excitation pulse varies within the object to be imaged.

The MRI system includes a trained machine learning module that generates shimming information as output based on the received pre-scan information.

It is possible that when the trained machine learning module generates the shimming information that shim currents are determined that are used by the shimming module to determine the corrected magnetic field B0. Accordingly, in this embodiment, the trained machine learning module directly determines from the input, the pre-scan information, the shim currents that are used by the shimming module.

Furthermore, it is possible that the trained machine learning module, with the input of the pre-scan information, determines a B0 inhomogeneity map of the MR. The B0 inhomogeneity map is then used to determine the shim currents.

For determining the pre-scan information, it is possible to determine image data wherein the image data show at least the object, preferably the contour of the object. From the image data, an object geometry of the object can be determined, and the trained machine learning module determines the shimming information taking into account the object geometry.

Furthermore, it is possible that an object specific model is used including an internal tissue composition of the object that is then fitted to the prescan information. The object specific model having the geometry of the object and tissue composition may be trained concurrently and implicitly. Thus, the object specific model may also be learned during the training of the neural network.

The image data may be generated by an optical camera, such as a depth camera located at or in the MR imaging system or by the MR imaging system itself when an overview image is generated with the object being present in the MR imaging system.

Furthermore, it is possible to determine an SAR (specific absorption rate) map considering the object located in the MR imaging system, wherein the shimming information is determined to take into account the SAR map.

The SAR map can be part of the pre-scan information applied to the trained machine learning module, and the trained machine learning module has been trained to determine the shimming information based on training data including training SAR maps.

The trained machine learning module can include a trained neural network that has been trained using supervised learning, or semi supervised or self-supervised learning.

Furthermore, it is possible that the pre-scan information includes, in addition to the object specific information, system specific information including information about a number and a design of at least one shim coil used to correct the B0 inhomogeneities.

FIG. 1 shows a schematic view of an MR imaging system 9, which includes a magnet 10 generating the magnetic field B0. An object under examination 13 lying on a table 12 is moved into the center of the MR imaging system 9, where the MR signals can be detected after excitation by an RF pulse by receiving coils 11. By applying RF pulses and magnetic field gradients, the nuclear spins of the object 13, especially the part located near the receiving coil, are excited and location coded, and currents induced by the relaxation can be detected. The way how MR images are generated and how the MR signals are detected using a sequence of RF pulses and a sequence of magnetic field gradients is known in the art so that a detailed explanation thereof is omitted.

The MR system, furthermore, includes shim coils 8 which are schematically shown and which are used to correct the inhomogeneities of the magnetic field B0.

The MR imaging system includes a control module (controller) 50 which is used for controlling the MR imaging system. The control module 50 includes a gradient control unit (controller or software module) 14 for controlling and switching the magnetic field gradients, an RF control unit (controller or software module) 15 for controlling and generating RF pulses for the imaging sequences. An image sequence control unit (controller or software module) 16 is provided which controls the sequence of the applied RF pulses and magnetic field gradients and thus also partly controls the gradient control unit 14 and the RF control unit 15. In a memory 17, computer programs needed for operating the MR imaging system and the imaging sequences necessary for generating the MR images can be stored together with the generated MR images. The MR images or any further information can be displayed on a display 18, wherein a human machine interface (graphics user interface) 19 is provided which can be used by an operator of the MR imaging system to control the MR imaging system. Furthermore, a machine learning module 20 is provided which includes a trained neural network and which is configured to generate shimming information as will be discussed below. Furthermore, a shimming module (controller or software module) 22 is provided which is configured to control the shim currents used in the shim coils 8.

A central processing unit (CPU or processor) 21 can coordinate the operation of the different functional units shown in FIG. 1 and can include one or more processors that can carry out instructions stored in the memory 17. The memory can include program code to be executed by the processing unit 21.

Furthermore, an image sensor 30 or several sensors can be provided which generate an image or picture of the object 13 either before it is moved into the center of the magnet or when located in the magnet or during the imaging. The camera can be a CCD camera or any other imaging system or optical camera. The camera may also be a 3D camera configured to generate a depth image of the environment where the generated image data contain a depth information meaning how far each pixel shown in the image is located away from the camera 30. The image generated by the image sensor 30 can then be used and processed, e.g., by the processing unit 21, to determine the geometry from the object under examination.

Figure 2:
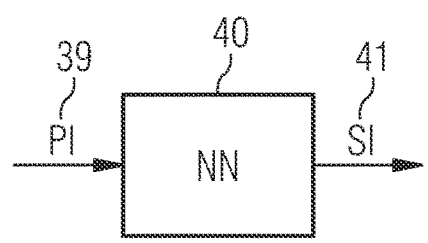
FIG. 2 shows a schematic view of an example neural network used in the machine learning module to generate shimming information.

The machine learning module 20 includes a trained neural network 40. As shown in FIG. 2, the trained neural network 40 receives as an input the pre-scan information 39. The output of the trained neural network 40 is the shimming information 41. During training, the prescan information (e.g., a depth image and/or a localizer scan and/or patient information) and the corresponding optimum shimming parameters (and/or the intermediate inhomogeneity maps) are used as input/output pairs. Here, the optimum shimming parameters (the output) and/or the inhomogeneity map (the intermediate output) may be computed using offline simulations and computations as they may be computationally costly, and it may not be feasible to do it during inference time. During inference, given the prescan information and the trained network, the shimming parameters are estimated using a simple forward pass of the trained network.

The pre-scan information can include any prior knowledge of the shimming hardware, and any sensor data from the image sensor and/or any localizer or adjustment scans carried out by the MR imaging system, however it does not include the shimming scan, here the B1 map. Accordingly, the pre-scan information includes object specific information relating to the object under examination and system specific information containing information about the MR imaging system, such as the hardware, the number and geometry of coils etc.

The neural networks 40 can be trained in different ways. It is possible to train the neural network such that with the input of the pre-scan information, the neural network directly determines the shim parameters such as the shim currents that are used by the shim coils 8 for eliminating or minimizing the magnetic field inhomogeneities. Furthermore, it is possible that the neural network, based on the pre-scan information, determines an inhomogeneity map of the magnetic field B0, which is then used by the shimming module 22 of FIG. 1 in order to determine the shim currents as known in the art when the B0 inhomogeneity map is available.

A depth image of the object may be generated by the camera 30. The depths image is used together with a patient specific model with internal tissue composition, and the external body shape as deduced from the image data is fitted to this depth image so that a patient specific model is used for estimating the B0 inhomogeneities. The patient specific model can be generated by the neural network. During training, an implicit representation of the human body and tissue composition is learned. This can be a process of taking high-dimensional, heterogeneous input and projecting it into a much lower dimensional manifold. This manifold is the representation of the human body and tissue composition. During inference, a new input is used and projected into this space. The projected point is the patient specific model Furthermore, it is possible that an object specific absorption rate, the specific absorption rate, SAR, are incorporated into the estimation of the optimum shimming parameters.

Figure 3:
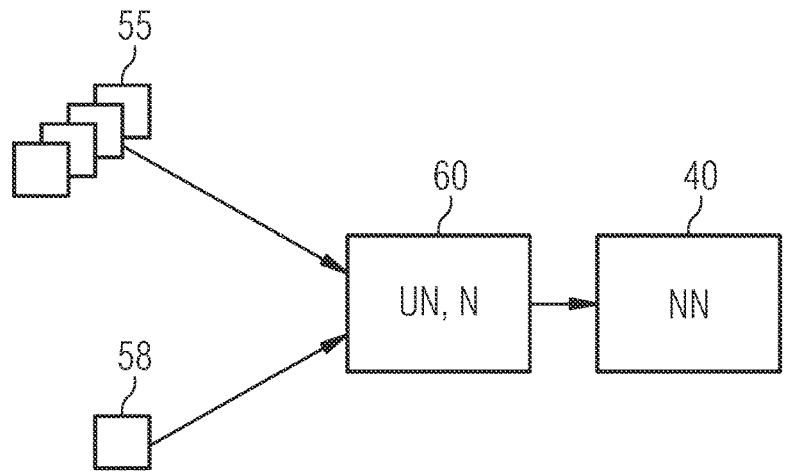
FIG. 3 shows a schematic view of how the neural network of FIG. 2 is trained to be able to output the shimming information, according to one embodiment.

FIG. 3 shows an example of training an untrained neural network 60 for determining the shimming information as discussed above. The network 60 receives as an input a known pre-scan information that includes object specific information 55 and system specific information 58.

Furthermore, a system specific information 58 is provided which includes details about the number and the design of the shim coils used to correct the B0 inhomogeneities. The training data furthermore, contain the results, namely the shimming information calculated for the training pre-scan information, the object specific information 55, and the system specific information 58. The untrained neural network 60 is then trained in a supervised learning method in a known manner until the neural network, the trained neural network 40 is obtained.

Figure 4:
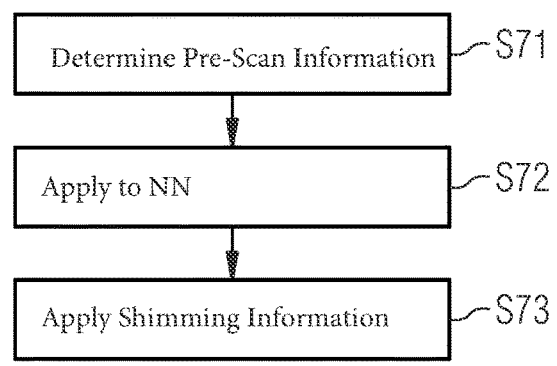
FIG. 4 shows a schematic view of one embodiment of a flowchart including the acts carried out by the MR imaging system to correct the object specific inhomogeneities.

FIG. 4 summarizes some of the acts carried out by the MR imaging system discussed above. In act S71, pre-scan information is determined which is available at the MR imaging system. The pre-scan information can contain the object specific information of the object and can include the system specific information. The object specific information can be obtained as discussed in further detail in connection with FIG. 5 below where image data and the object geometry is used to generate the object specific pre-scan information. Once the pre-scan information is determined, the pre-scan information is applied to the trained neural network in act S72. As discussed in connection with FIG. 2, the output of the network 40 contains shimming information, wherein the shimming information can include the shim currents or the B0 inhomogeneity map for the object located in the MR imaging system. In act S73, the shimming information is then applied to shimming module 22 which uses the shimming information in order to generate the corrected magnetic field B0.

Figure 5:
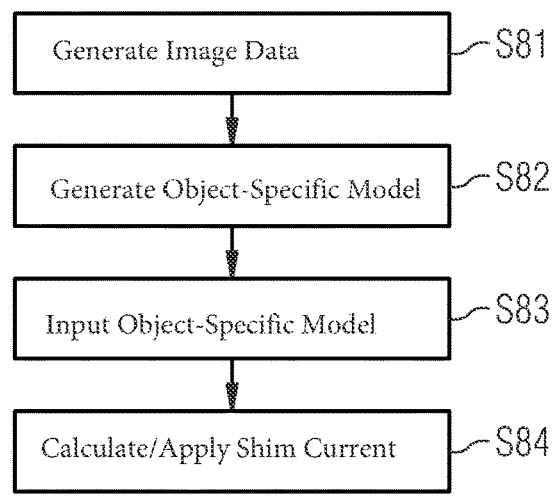
FIG. 5 shows a further schematic view of an embodiment of a flowchart including the acts carried out by the MR imaging system to determine and correct object specific inhomogeneities.

FIG. 5 provides a more detailed view of how the object specific information may be obtained. In act S81, the image data is generated, wherein the image data may be generated using the camera 30 or may be generated by the MRI system from the localizer image or any other overview image generated at the beginning of an examination when the object or patient is located in the scanner. In act S82, the object specific model is generated. To this end, the external body shape is deduced from the obtained image. Furthermore, the external body shape and the tissue model are fitted to this image so that the object specific or patient specific model is generated. This object specific model is then input into the trained neural network in order to estimate either the B0 inhomogeneity or the shim currents (S83). In act S84, the shimming module then uses the shimming information in order to calculate the shim currents if needed, and otherwise, if the shim currents were already determined from the neural network, the shim currents are applied in act S84 by the shimming module.

The invention discussed above provides a method which eliminates the explicit shimming scan. With the method explained above, it is possible to control an arbitrarily complex shimming hardware as the method can learn the best control mechanisms of very complex shimming hardware as a large number of parameters and there is no time penalty for the increased complexity.

The invention claimed is:

1. A method for correcting object specific in-homogeneities in an MR imaging system, the method comprising:

determining prescan information available at the MR imaging system, the prescan information comprising at least an object geometry of an object located in the MR imaging system from which an MR image is to be generated, the object geometry determined from image data of the object acquired using an optical camera, the prescan information not including a B1 map of the MR imaging system with the object being present in the MR imaging system, applying the prescan information to a trained machine learning module provided at the MR imaging system, the trained machine learning module determining and generating shimming information as output, applying the shimming information to a shimming module of the MR imaging system, wherein the shimming module uses the shimming information in order to generate a corrected magnetic field B0.

2. The method of claim 1, wherein determining the shimming information comprises determining shim currents used by the shimming module to determine the corrected magnetic field B0.

3. The method of claim 1, wherein determining the shimming information comprises determining a B0 inhomogeneity map of the MR imaging system.

4. The method according to claim 1, wherein the object geometry comprises an internal tissue composition of the object.

5. The method according to claim 1, further comprising determining an SAR map taking into account the object located in the MR imaging system, wherein the shimming information is determined taking into account the SAR map.

6. The method according to claim 5, wherein SAR map is part of the prescan information applied to the trained machine learning module, wherein the trained machine learning module has been trained to determine the shimming information based on training SAR maps.

7. The method according to claim 1, wherein the trained machine learning module has been trained using supervised learning.

8. The method according to claim 1, wherein the prescan information further comprises system specific information including information about a number and a design of at least one shim coil used to correct Bo in-homogeneities.

9. An MR imaging system configured to correct object specific in-homogeneities of an object located in the MR imaging system, the MR imaging system comprising:
 a trained machine learning module,
 a shimming module configured to generate a corrected magnetic field B0, wherein the MR imaging system is configured to:
 determine prescan information available at the MR imaging system, the prescan information comprising at least an object geometry of an object located in the MR imaging system from which an MR image is to be generated, the object geometry determined from image data of the object acquired using an optical camera, the prescan information not including a B1 map of the MR imaging system with the object being present in the MR imaging system,
 apply the prescan information to the trained machine learning module provided at the MR imaging system, the trained machine learning module being configured to determine and generate shimming information as output,
 apply the shimming information to the shimming module of the MR imaging system, wherein the shimming module is configured to use the shimming information in order to generate a corrected magnetic field B0.

10. The MR imaging system according to claim 9, wherein the trained machine learning module is configured to determine the shimming information as shim currents used by the shimming module to determine the corrected magnetic field B0.

11. The MR imaging system according to claim 9, wherein the trained machine learning module is configured to determine the shimming information as a B0 inhomogeneity map of the MR imaging system.

12. The MR imaging system of claim 9, wherein the prescan information further comprises an object specific model including an internal tissue composition of the object.

13. The MR imaging system according to claim 9, wherein the prescan information comprises an SAR map of the object located in the MR imaging system, wherein the shimming information accounts for the SAR map, wherein SAR map is part of the prescan information applied to the trained machine learning module.

14. The MR imaging system according to claim 9, wherein the trained machine learning module has been trained using supervised learning.

15. The MR imaging system according to claim 9, wherein the prescan information further comprises system specific information including information about a number and a design of at least one shim coil used to correct Bo in-homogeneities.

* * * * *